United States Patent

Yokoyama

[11] Patent Number: 6,072,372
[45] Date of Patent: *Jun. 6, 2000

[54] RING-TYPE VOLTAGE-CONTROLLED OSCILLATOR HAVING A SUB-FREQUENCY BAND SELECTION CIRCUIT

[75] Inventor: Tomonobu Yokoyama, Tokyo, Japan

[73] Assignee: Oki Electric Industry Co., Ltd., Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/966,217

[22] Filed: Nov. 7, 1997

[51] Int. Cl.$^7$ ............................. H03B 5/24; H03L 7/099
[52] U.S. Cl. ................. 331/57; 331/34; 331/177 R; 331/179; 331/185
[58] Field of Search ................... 331/34, 57, 177 R, 331/179, 185, 186

[56] References Cited

U.S. PATENT DOCUMENTS

| | | | |
|---|---|---|---|
| 5,142,249 | 8/1992 | Hirotomi | 331/57 |
| 5,208,557 | 5/1993 | Kersh, III | 331/57 |
| 5,416,446 | 5/1995 | Holler, Jr. et al. | 331/57 |
| 5,446,417 | 8/1995 | Korhonen et al. | 331/57 |
| 5,691,661 | 11/1997 | Fukuda et al. | 327/172 |
| 5,703,541 | 12/1997 | Nakashima | 331/57 |
| 5,777,520 | 7/1998 | Kawahami | 331/57 X |

FOREIGN PATENT DOCUMENTS

| | | |
|---|---|---|
| 63-260316 | 10/1988 | Japan . |
| 4-304708 | 10/1992 | Japan . |
| 5-268002 | 10/1993 | Japan . |
| 6-21776 | 1/1994 | Japan . |
| 6-104638 | 4/1994 | Japan . |
| 6-169237 | 6/1994 | Japan . |
| 8-330912 | 12/1996 | Japan . |

*Primary Examiner*—David Mis
*Attorney, Agent, or Firm*—Jones Volentine, LLP

[57] ABSTRACT

With a VCO 1 which constitutes the voltage controlled oscillator according to the present invention, since NMOS transistors N11, N12 and N13 are provided in each of inverter circuits 11, 12 and 13, the oscillating frequency band can be divided into three sub ranges. As a result, even when the VCO gain effected by a control signal VCN is reduced, a wide frequency band is assured, thereby making it possible to easily support the clock frequency required by the system into which the VCO 1 is to be incorporated.

17 Claims, 10 Drawing Sheets

Voltage Level of Control Signal VCN (Vc)

RING-TYPE VOLTAGE-CONTROLLED OSCILLATOR HAVING A SUB-FREQUENCY BAND SELECTION CIRCUIT

BACKGROUND OF THE INVENTION

The present invention relates to a voltage controlled oscillator (VCO) and, in particular, it relates to a voltage controlled oscillator that may be used for a phase-locked loop (PLL).

Voltage controlled oscillators that are formed by connecting in series an odd number of complementary type MOS inverters in a ring, are disclosed in Japanese Unexamined Patent Publication No 268002/1993 and the like The voltage controlled oscillator (hereafter referred to as "VCO") 101 disclosed in the publication above is explained in reference to FIGS. 9 and 10.

This VCO 101 is constituted of inverter circuits 111, 112 and 113 which are connected in series in a ring forming a loop. It is to be noted that the inverter circuits 111, 112 and 113 are structured almost identically to one another and, therefore, only the structure of the inverter circuit 111 will be explained here as a representative example.

The inverter circuit 111 is provided with a PMOS transistor P1, an NMOS transistor N1 and an NMOS transistor N10.

The gates of the PMOS transistor P1 and the NMOS transistor N1 are commonly connected to an input IN 111 of the inverter circuit 111, whereas the drains of the PMOS transistor P1 and the NMOS transistor N1 are commonly connected to an output OUT 111 of the inverter circuit 111. The source of the PMOS transistor P1 is connected to a source voltage level VD and the source of the NMOS transistor N1 is connected to the drain of the NMOS transistor N10.

In addition, the source of the NMOS transistor N10 is connected to a ground level, and a control signal VCN is input to its gate. It is to be noted that this control signal VCN is also input to the inverter circuits 112 and 113, being connected to the gates of their NMOS transistors (not shown) which have functions and structural features identical to those of the NMOS transistor N10 in the inverter circuit 111.

The output OUT 111 of the inverter circuit 111 which is structured as described above, is connected to an input IN 112 of the inverter circuit 112, the output OUT 112 of the inverter circuit 112 is connected to an input IN 113 of the inverter circuit 113 and an output OUT 113 of the inverter circuit 113 is connected to the input IN 111 of the inverter circuit 111. In other words, the VCO 101 is constituted as a ring oscillator in which the inverter circuits 111, 112 and 113 are connected in a ring.

Now, the oscillating frequency (f) of the VCO 101 is expressed as 1/(td* n), with (td) representing the transmission delay time corresponding to one stage of the inverter circuit and (n) representing the number of stages of the inverter circuit. In addition, the transmission delay time (td) of the inverter circuits 111, 112 and 113 is dependent upon the voltage level of the control signal VCN.

For instance, when the voltage level (Vc) of the control signal VCN is reduced, the on resistance of the NMOS transistor N10 increases, thereby lengthening the fall time of the voltage levels of the individual output signals at the outputs OUT 111, 112 and 113 of the inverter circuits 111, 112 and 113 respectively. This increases the transmission delay time (td) and, as a result, the oscillating frequency (f) of the VCO 101 is reduced. If, on the other hand, the voltage level of the control signal VCN is increased, the on resistance of the NMOS transistor N10 becomes lower, thereby shortening the fall time of the voltage levels at the outputs OUT 111, 112 and 113 of the inverter circuits 111, 112 and 113 respectively. Thus, the transmission delay time (td) is reduced and, as a result, the oscillating frequency (f) of the VCO 101 becomes higher.

Since different clock frequencies are normally required for individual systems in which the VCO 101 is employed, it is necessary to broaden the band of the oscillating frequency (f) in order to achieve a versatile VCO 101 which can be adopted in a number of different systems. For instance, in order to support two systems, i.e., one with a clock frequency of 100 MHz and the other with a clock frequency of 300 MHz, the oscillating frequency (f) must change within the range of, at least, 100 MHz–300 MHz relative to the voltage level variable width of the control signal VCN, e.g., 0–3.3 V, as shown in FIG. 10.

However, when such a wide oscillating frequency (f) band is to be covered, the amount of change in the oscillating frequency (f) relative to the voltage level (Vc) of the control signal VCN (hereafter referred to as the "VCO gain": VCO gain=f/Vc) increases, the oscillating frequency (f) is caused to fluctuate greatly by a minute fluctuation in the voltage level (Vc) of the control signal VCN. Such a fluctuation of the oscillating frequency (f) may cause jitter, which may, in turn, detract from the stability of the system.

In addition, if the band of the oscillating frequency (f) is reduced in order to eliminate the problem discussed above, the versatility of the VCO will be sacrificed, which may present difficulty in obtaining a desired oscillating frequency. Thus, since it is necessary to optimize the oscillating frequency of the VCO to support the frequency required by the system in which the VCO is to be incorporated, a new VCO must be designed for every case.

SUMMARY OF THE INVENTION

Accordingly, an object of the present invention is to provide a new and improved VCO with a wide oscillating frequency band, which is capable of achieving a stable oscillating frequency.

In order to achieve the object described above, the voltage controlled oscillator according to the present invention is structured as described below.

Namely, the voltage controlled oscillator is provided with an odd number of inverter circuits which are connected in series in a ring. The voltage controlled oscillator is further provided with a sub-frequency band selection circuit which divides the frequency band of the output pulse signal output by each inverter circuit into a plurality of sub frequency bands and selects one sub frequency band which includes a desired frequency from among the plurality of sub frequency bands, and an output pulse signal frequency adjustment circuit that is capable of adjusting the frequency of the output pulse signal output by each inverter circuit within the one sub frequency band.

In this structure, the oscillating frequency band of the voltage controlled oscillator is divided into a plurality of sub frequency bands and the sub frequency band containing the desired frequency can be selected with the sub frequency band selection circuit. Consequently, the adjustment of the oscillating frequency by the output pulse signal frequency adjustment circuit is facilitated, resulting in a stable oscillating frequency.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments. In the drawings.

PREFERRED EMBODIMENTS OF THE INVENTION

The following is a detailed explanation of the embodiments of the VCO according to the present invention given in reference to the attached drawings. It is to be noted that in the following explanation, the same reference numbers are used to refer to components having the same functions and structural features so that repeated explanation of them may be omitted.

(First embodiment)

Figure 1:
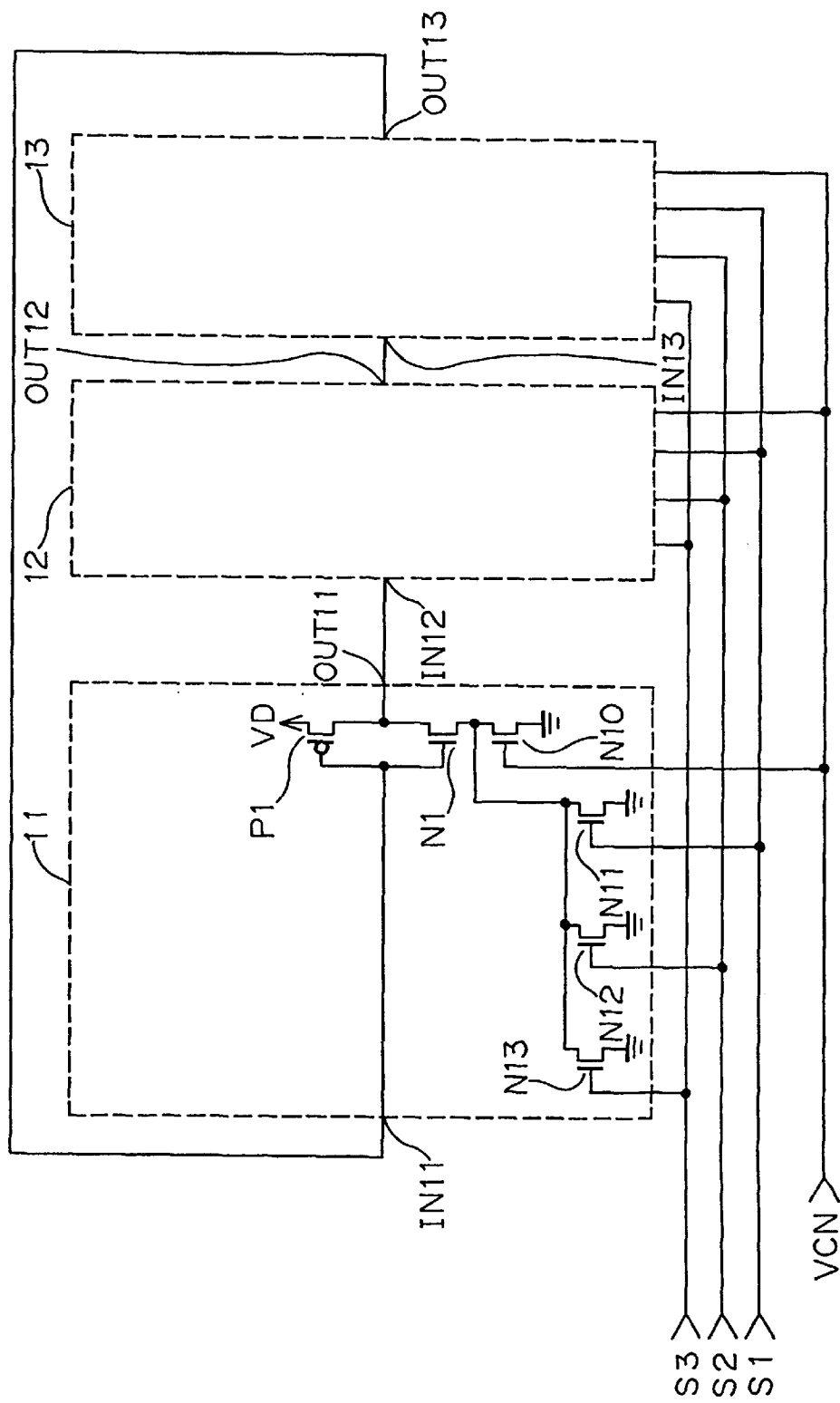
FIG. 1 is a circuit block diagram of the VCO in a first embodiment of the present invention.

The structure of the VCO 1 in the first embodiment is shown in FIG. 1. This VCO 1 is constituted of inverter circuits 11, 12 and 13 which are connected in series in a ring to form a loop. These inverter circuits 11, 12 and 13 are each structured by adding NMOS transistors N11, N12 and N13 to each of the inverter circuits 111, 112 and 113 constituting the VCO 101 in the prior art. It is to be noted that since the inverter circuits 11, 12 and 13 are structured almost identically to one another, the structure of the inverter circuit 11 is explained here as a representative example.

The gates of the PMOS transistor P1 and the NMOS transistor N1 are commonly connected to an input IN 11 of the inverter circuit 11, whereas the drains of the PMOS transistor P1 and the NMOS transistor N1 are commonly connected to an output OUT 11 of the inverter circuit 11. The source of the PMOS transistor P1 is connected to a source voltage level VD and the source of the NMOS transistor N1 is commonly connected to the drains of the four NMOS transistors N10, N11, N12 and N13.

In addition, the sources of these four NMOS transistors N10, N11, N12 and N13 are all connected to a ground level.

A control signal VCN is input to the gate of the NMOS transistor N10, a control signal S1 is input to the gate of the NMOS transistor N11, a control signal S2 is input to the gate of the NMOS. transistor N13 and a control signal S3 is input to the gate of the NMOS transistor N13. It is to be noted that the control signals VCN, S1, S2 and S3 are also input to the inverter circuits 12 and 13, through connections to the gates of the NMOS transistor groups (not shown) having functions and structural features identical to those of the NMOS transistors N10, N11, N12 and N13 in the inverter circuit 11.

The output OUT 11 of the inverter circuit 11 which is structured as described above, is connected to an input IN 12 of the inverter circuit 12, the output OUT 12 of the inverter circuit 12 is connected to an input IN 13 of the inverter circuit 13 and an output OUT 13 of the inverter circuit 13 is connected to the input IN 11 of the inverter circuit 11. In other words, the VCO 1 is constituted as a ring oscillator in which the inverter circuits 11, 12 and 13 are connected in a ring.

The operation of the VCO 1 in the first embodiment structured as described above is now explained in reference to FIG. 2.

Figure 9:
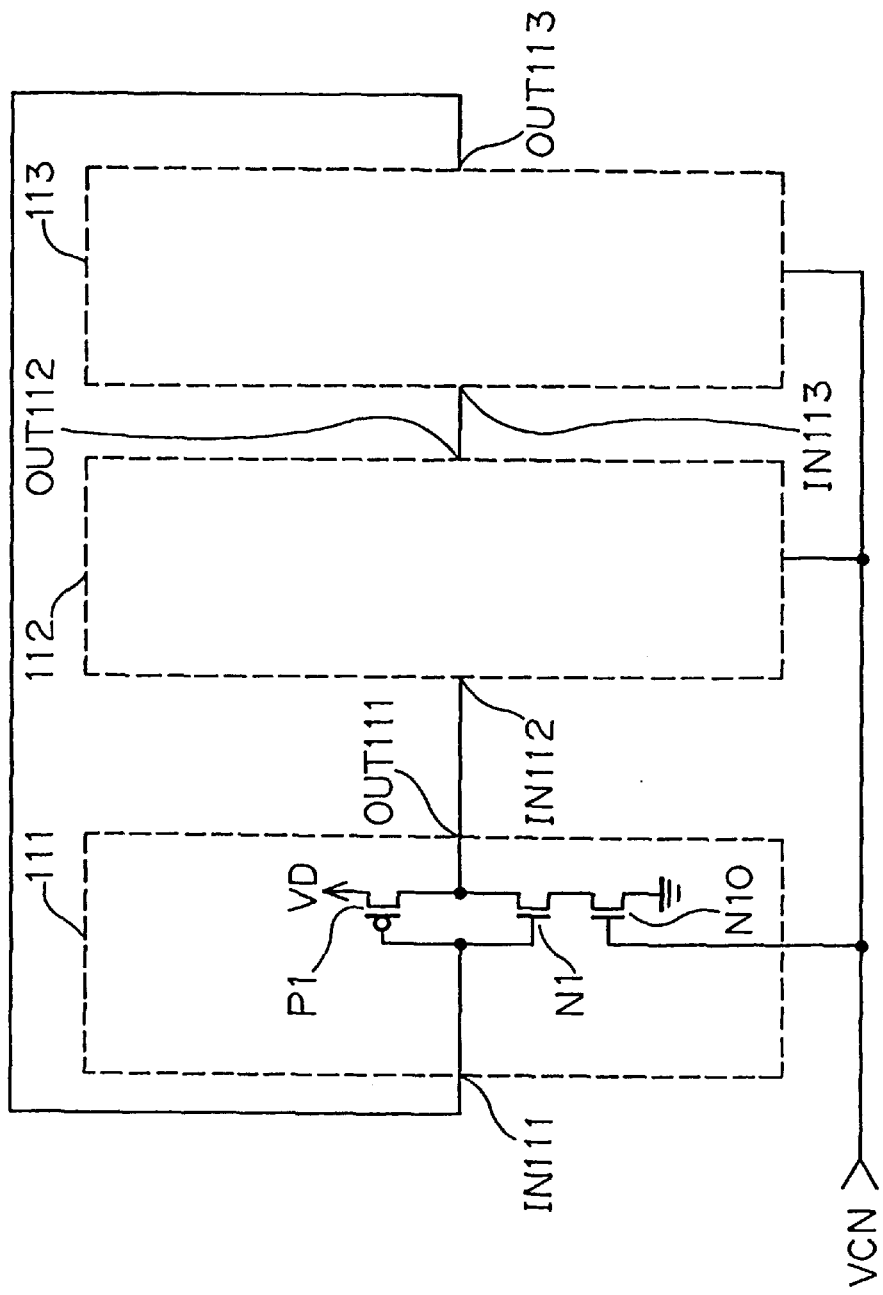
FIG. 9 is a circuit block diagram of a VCO in the prior art.
Figure 10:
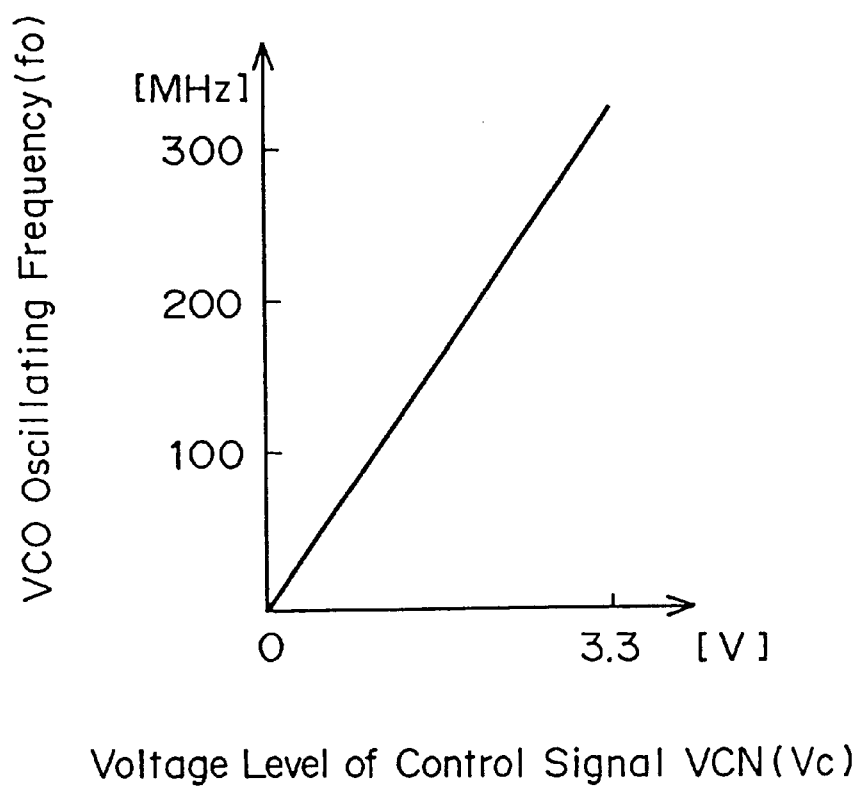
FIG. 10 is a characteristics diagram showing the oscillating frequency characteristics of the VCO in the prior art.

When the control signal S1 is set to H and the control signals S2 and S3 are set to L, the NMOS transistor N11 enters an on state and the NMOS transistors N12. and N13 enter an off state. Transmission delay times at the inverter circuit 11, 12 and 13 change depending upon the length of time required for the voltage levels of the output signals at the outputs OUT 11, 12 and 13 to shift from H to L, i.e., the length of the discharge time. This discharge time is determined depending upon the sum of the drain current at the NMOS transistor N11 and the drain current at the NMOS transistor N10, and if the control signal VCN is changed, for instance, from 0 V to 3.3 V in this state, the VCO 1 oscillates in the frequency band represented by the characteristics (a) in FIG. 9.

In contrast, when the control signals S1 and S2 are set to H and the control signal S3 is set to L, the NMOS transistors N11 and N12 enter an on state and the NMOS transistor N13 enters an off state. If the control signal VCN is changed, for instance, from 0 V to 3.3 V in this state, the VCO 1 oscillates in the frequency band represented by the characteristics (b) in FIG. 9.

Furthermore when the control signals S1, S2. and S3 are set to H, the NMOS transistors N11, N12 and N13 all enter an on state. If the control signal VCN is changed, for instance, from 0 V to 3.3 V in this state, the VCO 1 oscillates in the frequency band represented by the characteristics (c) in FIG. 9.

Figure 2:
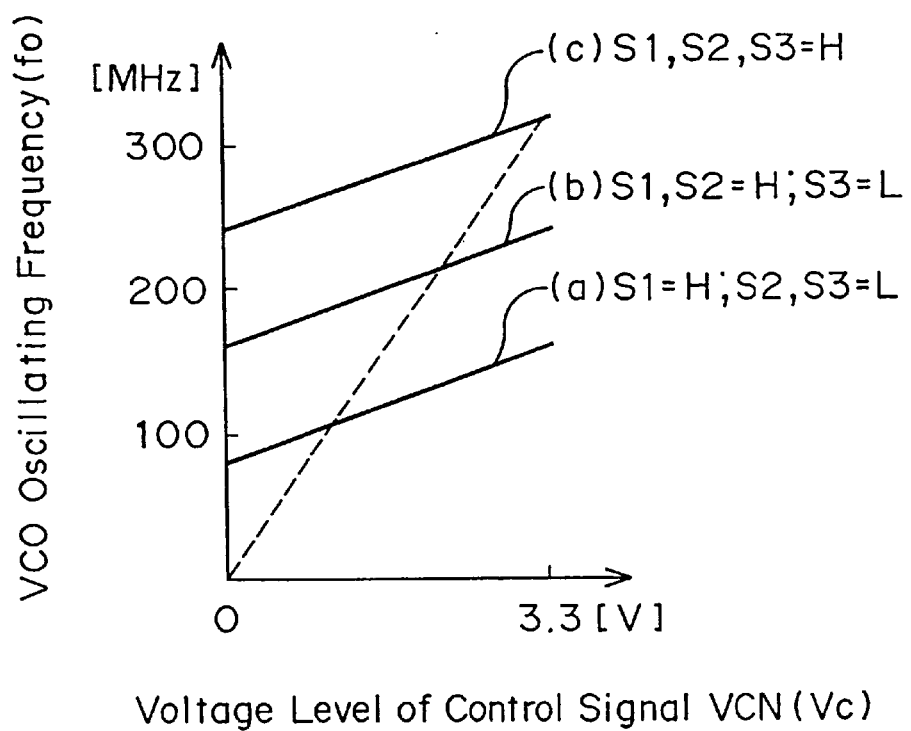
FIG. 2 is a characteristics diagram showing the oscillating frequency characteristics of the VCO in the first embodiment of the present invention shown in FIG. 1.

It is to be noted that in FIG. 2, the broken line indicates the oscillating frequency characteristics of the VCO 101.

As has been explained with the VCO 1 in the first embodiment, since the NMOS transistors N11, N12 and N13 are constituted as constant current sources and the NMOS transistor N10 is constituted as a variable current source, the oscillating frequency band can be divided into, for instance, three bands through different combinations of the control signals S1 S2 and S3. Consequently, even when the VCO gain effected by the control signal VCN is set at a small value, a wide frequency band can be assured, thereby making it possible to support the clock frequency required by any system in which the VCO 1 is to be employed with ease. In addition, since the VCO gain can be set at a low level, a stable clock signal with very little jitter can be provided to the system.

(Second embodiment)

Figure 3:
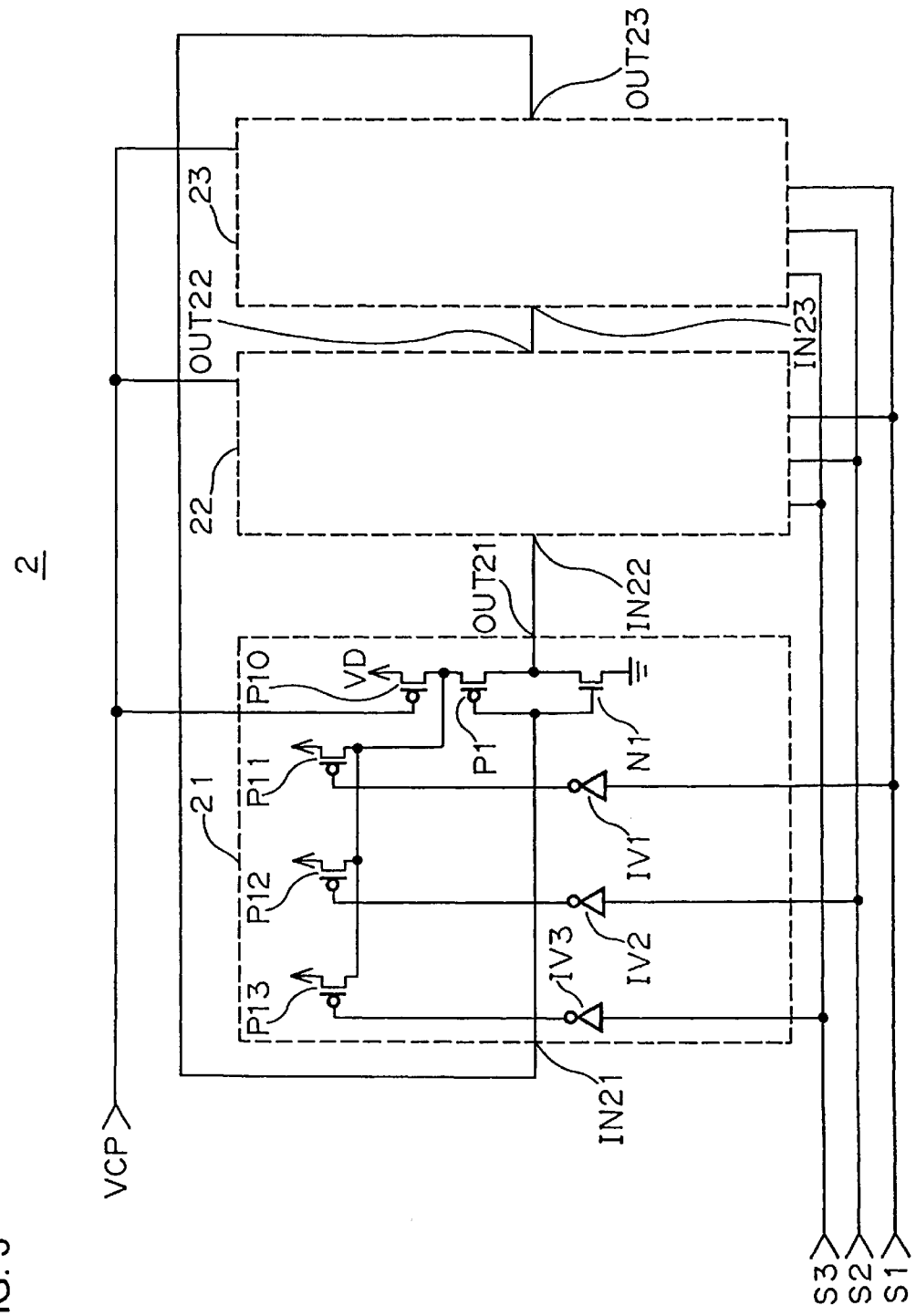
FIG. 3 is a circuit block diagram of the VCO in a second embodiment of the present invention.

The structure of the VCO 2 in the second embodiment is shown in FIG. 3. This VCO 2 is constituted of inverter circuits 21, 22 and 23 which are connected in series in a ring to form a loop. These inverter circuits 21, 22 and 23 are each structured by adding PMOS transistors P11, P12 and P13 and inverter gates IV 1, IV 2 and IV 3. to each of the inverter circuits 111, 112 and 113 constituting the VCO 101 in the prior art, with the NMOS transistor N10 replaced by a PMOS transistor P10. It is to be noted that since the inverter circuits 21, 22 and 23 are structured almost identically to one another, only the structure of the inverter circuit 11 is explained here as a representative example.

The gates of the PMOS transistor P1 and the NMOS transistor N1 are commonly connected to an input IN 21 of the inverter circuit 21, whereas the drains of the PMOS transistor P1 and the NMOS transistor N1 are commonly connected to an output OUT 21 of the inverter circuit 21. The source of the NMOS transistor N1 is connected to a ground level and the source of the PMOS transistor P1 is commonly connected to the drains of the four PMOS transistors P10, P11, P12 and P13.

In addition, the sources of these four PMOS transistors P11, P11, P12 and P13 are all connected to a source voltage level VD.

A control signal VCP is input to the gate of the PMOS transistor P10, a control signal S1 is input to the gate of the PMOS transistor P11 via the inverter gate IV 1, a control signal S2 is input to the gate of the PMOS transistor P12 via the inverter gate IV 2 and a control signal S3 is input to the gate of the PMOS transistor P13 via the inverter gate IV 3. It is to be noted that the control signals VCP, S1, S2 and S3 are also input to the inverter circuits 22 and 23 which have functions and structural features almost identical to the inverter circuit 21.

The output OUT 21 of the inverter circuit 21 which is structured as described above, is connected to an input IN 22 of the inverter circuit 22, an output OUT 22 of the inverter circuit 22 is connected to an input IN 23 of the inverter circuit 23 and an output OUT 23 of the inverter circuit 23 is connected to the input IN 21 of the inverter circuit 21. In other words, the VCO 2 is constituted as a ring oscillator in which the inverter circuits 21, 22 and 23 are connected in a ring.

The operation of the VCO 2 in the second embodiment structured as described above is now explained.

When the control signal S1 is set to H and the control signals S2 and S3 are set to L, the PMOS transistor P11 enters an on state and the PMOS transistors P12 and P13 enter an off state. Transmission delay times at the inverter circuit 21, 22 and 23 change depending upon the length of time required for the voltage levels of the output signals at the outputs OUT 21, 22 and 23 to shift from L to H, i.e., the length of charge time. This charge time is determined depending upon the sum of the drain current at the PMOS transistor P11 and the drain current at the PMOS transistor P10.

In contrast, when the control signals S1 and S2 are set to H and the control signal S3 is set to L, the PMOS transistors P11 and P12 enter an on state and the PMOS transistor P13 enters an off state.

When the control signals S1, S2 and S3 are set to H, the PMOS transistors P11, P12 and P13 all enter an on state.

As has been explained, with the VCO 2 in the second embodiment, since the PMOS transistors P11, P12 and P13 are constituted as constant current sources and the PMOS transistor P11 is constituted as a variable current source, the oscillating frequency band can be divided into, for instance, three bands through different combinations of the control signals S1, S2 and S3 as in the VCO 1 in the first embodiment. Consequently, even when the VCO gain effected by the control signal VCN is set at a small value, a wide frequency band can be assured, thereby making it possible to support the clock frequency required by any system in which the VCO 2 is to be employed with ease. In addition, since the VCO gain can be set at a low level, a stable clock signal with very little jitter can be provided to the system.

(Third embodiment)

Figure 4:
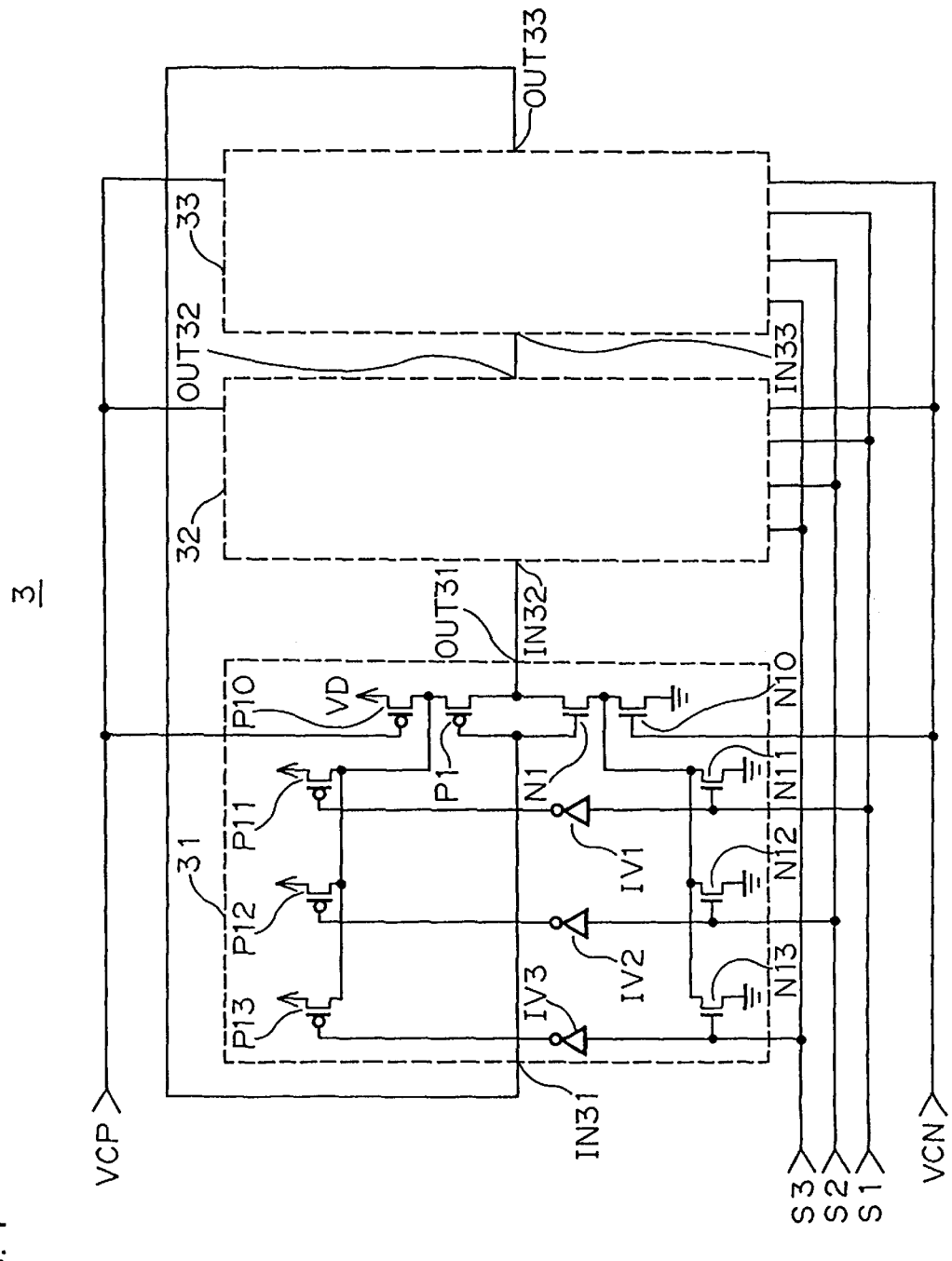
FIG. 4 is a circuit block diagram of the VCO in a third embodiment of the present invention.

The structure of the VCO 3 in the third embodiment is shown in FIG. 4. This VCO 3 is constituted of inverter circuits 31, 32 and 33 which are connected in series in a ring to form a loop. These inverter circuits 31, 32 and 33 are each structured by adding NMOS transistors N11, N12 and N13, PMOS transistors P11, P11, P12 and P13 and the inverter gates IV 1, IV 2 and IV 3 to each of the inverter circuits 111, 112 and 113 constituting a VCO 101 in the prior art. It is to be noted that since the inverter circuits 31. 32 and 33 are structured almost identically to one another, the structure of the inverter circuit 31 is explained here as a representative example.

The gates of the PMOS transistor P1 and the NMOS transistor N1 are commonly connected to an input IN 31 of the inverter circuit 31, whereas the drains of the PMOS transistor P1 and the NMOS transistor N1 are commonly connected to an output OUT 31 of the inverter circuit 31. In addition, the source of the PMOS transistor P1 is commonly connected to the drains of the four PMOS transistors P10, P11, P12 and P13 and the sources of these four PMOS transistors P10, P11, P12 and P13 are all connected to a source voltage level VD.

Moreover, the source of the NMOS transistor N1 is commonly connected to the drains of the four NMOS transistors N10, N11, N12 and N13 and the sources of these four NMOS transistors N10, N11, N12 and N13 are all connected to a ground level.

A control signal VCP is input to the gate of the PMOS transistor P10, a control signal S1 is input to the gate of the PMOS transistor P11, via the inverter gate IV 1, a control signal S2 is input to the gate of the PMOS transistor P12 via the inverter gate IV 2 and a control signal S3 is input to the gate of the PMOS transistor P13 via the inverter gate IV 3.

In addition, a control signal VCN is input to the gate of the NMOS transistor N10, the control signal S1 is input to the gate of the NMOS transistor N11, the control signal S2 is input to the gate of the NMOS transistor N12 and the control signal S3 is input to the gate of the NMOS transistor N13.

It is to be noted that the control signals VCP, VCN, S1, S2 and S3 are also input to the inverter circuits 32 and 33 which have functions and structural features identical to the inverter circuit 31.

The output OUT 31 of the inverter circuit 31 which is structured as described above, is connected to an input IN 32 of the inverter circuit 32, an output OUT 32 of the inverter circuit 32 is connected to an input IN 33 of the inverter circuit 33 and an output OUT 33 of the inverter circuit 33 is connected to the input IN 31 of the inverter circuit 31. In other words, the VCO 3 is constituted as a ring oscillator in which the inverter circuits 31, 32 and 33 are connected in a ring.

The operation of the VCO 3 in the third embodiment structured as described above is now explained.

When the control signal S1 is set to H and the control signals S2 and S3 are set to L, the PMOS transistor P11 and the NMOS Transistor N11 enter an on state and the PMOS transistors P12 and P13 and the NMOS transistors N12 and N13 enter an off state. Transmission delay times at the inverter circuits 31, 32 and 33 change depending upon the length of time required for the voltage levels of the output signals at the outputs OUT 31, 32 and 33 to shift from H to L, i.e., the length of discharge time and also the length of time required for them to shift from L to H, i.e., the charge time. The discharge time is determined depending upon the sum of the drain current at the NMOS transistor N11 and the drain current at the NMOS transistor N10, whereas the charge time is determined depending upon the sum of the drain current at the NMOS transistor P11 and the drain current at the PMOS transistor P10.

In contrast, when the control signals S1 and S2 are set to H and the control signal S3 is set to L, the PMOS transistors P11 and P12 and the NMOS transistors N11 and N12 enter an on state and the PMOS transistor P13 and the NMOS transistor N13 enter an off state.

In addition, when the control signals S1, S2. and S3 are set to H, the PMOS transistors P11, P12 and P13. and the NMOS transistors N11, N12 and N13 all enter an on state.

As has been explained, with the VCO 3 in the third embodiment, since the PMOS transistors P11, P12 and P13 and the NMOS transistors N11, N12 and N13 are constituted as constant current sources and the PMOS transistor P10 and the NMOS transistor N10 are each constituted as a variable current source, the oscillating frequency band can be divided into, for instance, three bands through different combinations of the control signals S1 ,S2 and S3 as in the VCO 1 and the VCO 2 in the first and second embodiments. Consequently, even when the VCO gain effected by the control signal VCP and VCN is set at a small value, a wide frequency band can be assured, thereby making it possible to support the clock frequency required by any system in which the VCO 3 is to be employed with ease. In addition, since the VCO gain can be set at a low level, a stable clock signal with very little jitter can be provided to the system.

In particular, since it is possible to control the rises and the falls of the output signals from the outputs OUT 31, 32 and 33 of the individual inverter circuits 31, 32 and 33 in accordance with VCO 3, the duty ratio of the output signals can be adjusted easily, achieving a further stability in the clock signal to be provided for the system.

(Fourth embodiment)

Figure 5:
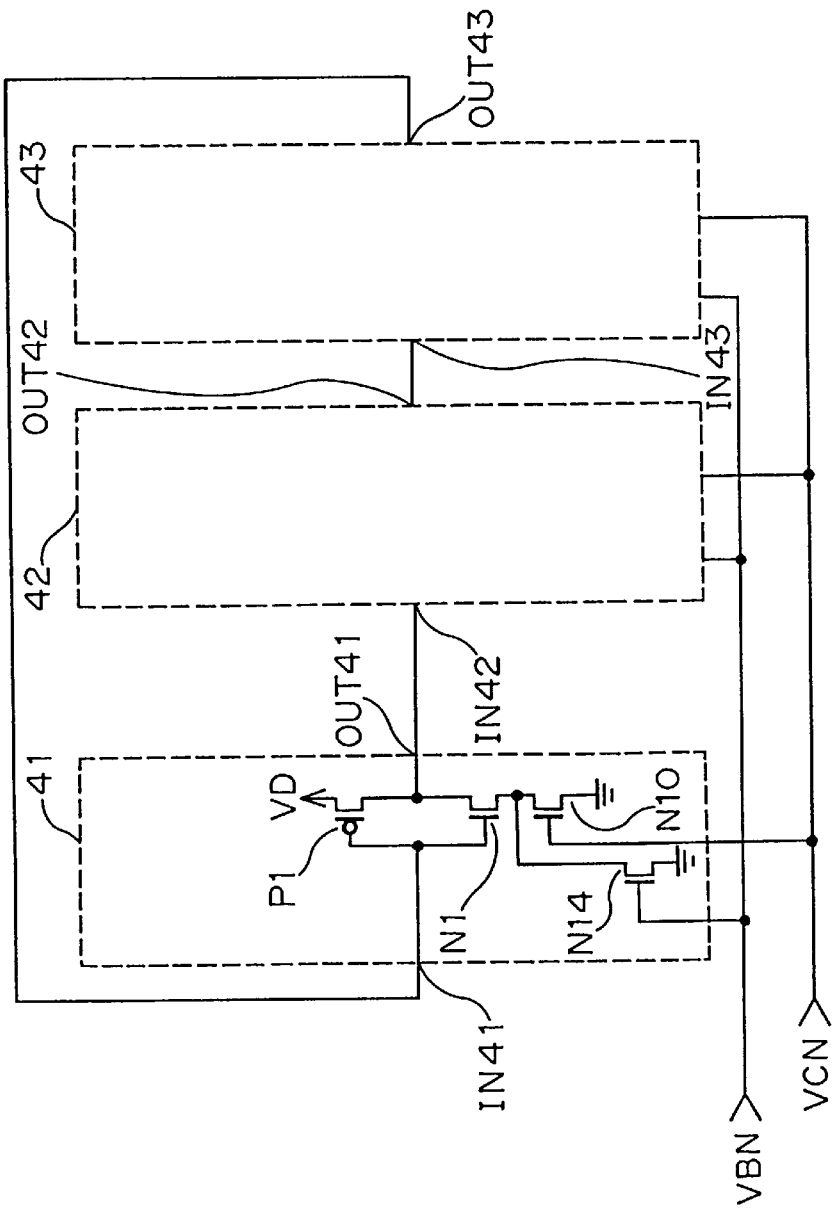
FIG. 5 is a circuit block diagram of the VCO in a fourth embodiment of the present invention.

The structure of the VCO 4 in the fourth embodiment is shown in FIG. 5. This VCO 4 is constituted of inverter circuits 41, 42 and 43 which are connected in series in a ring to form a loop. These inverter circuits 41, 42 and 43 are each structured to have an NMOS transistor N14 instead of the NMOS transistors N11, N12 and N13 in each of the inverter circuits 11, 12 and 13 constituting the VCO 1 in the first embodiment. It is to noted that since the inverter circuits 41, 42 and 43 are structured almost identically to one another, only the structure of the inverter circuit 41 is explained here as a representative example.

The gates of the PMOS transistor P1 and the NMOS transistor N1 are commonly connected to an input IN 41 of the inverter circuit 41, whereas the drains of the PMOS transistor P1 and the NMOS transistor N1 are commonly connected to an output OUT 41 of the inverter circuit 41. The source of the PMOS transistor P1 is connected to a source voltage level VD and the source of the NMOS transistor N1 is commonly connected to the drains of the NMOS transistors N10 and N14.

In addition, the sources of the NMOS transistors N10 and N14 are connected to a ground level.

A control signal VCN is input to the gate of the NMOS transistor N10 and a control signal VBN is connected to the gate of the NMOS transistor N14. It is to be noted that the control signals VCN and VBN are also input to the inverter circuits 42 and 43 through connections to the gates of the NMOS transistor groups (not shown) having functions and structural features identical to those of the NMOS transistor group, i.e., N10 and N14, in the inverter circuit 41.

The output OUT 41 of the inverter circuit 41 which is structured as described above, is connected to an input IN 42 of the inverter circuit 42, an output OUT 42 of the inverter circuit 42 is connected to an input IN 43 of the inverter circuit 43 and an output OUT 43 of the inverter circuit 43 is connected to the input IN 41 of the inverter circuit 41. In other words, the VCO 4 is constituted as a ring oscillator in which the inverter circuits 41, 42 and 43 are connected in a ring.

The operation of the VCO 4 in the fourth embodiment structured as described above is now explained.

First, the control signal VBN is set to a specific voltage level. Then, when the voltage level of the control signal VCN is changed, for instance, from 0 V to 3.3 V, the lengths of time required for the voltage levels of the output signals at the outputs OUT 41, 42 and 43 of the individual inverter circuits 41, 42 and 43 to shift from H to L, i.e., the discharge time changes, and when this happens, the oscillating frequency of the VCO 4 is adjusted to a specific value.

When the voltage level of the control signal VBN is set to a higher value and the control signal VCN is shifted, for instance, from 0 V to 3.3 V in this state, the oscillating frequency of the VCO 4 will change in a higher frequency band. If, in contrast, the voltage level of the control signal VBN is set to a lower level, and the control signal VCN is shifted, for instance, from 0 V to 3.3 V the oscillating frequency of the VCO 4 will change in a lower frequency band.

As has been explained, in the VCO 4 in the fourth embodiment, since the NMOS transistor N14 is constituted as a constant current source which can be readjusted and the NMOS transistor N10 is constituted as a variable current source, it becomes possible to divide the oscillating frequency band into an arbitrary number of ranges with the voltage level of the control signal VBN. Thus, the adjustment of the oscillating frequency can be performed with an even greater degree of ease and a higher degree of accuracy compared to the VCO 1, the VCO 2 and the VCO 3 in the first, second and third embodiments. In addition, since the VCO 4 in this embodiment is structured so that the NMOS transistor N14 constituting the constant current source is controlled only with the control signal VBN, miniaturization of the circuit scale is achieved in comparison to the VCO 1, the VCO 2 and the VCO 3 in the first, second and third embodiments, which all employ a plurality of control signals S1, S2 and S3.

(Fifth embodiment)

Figure 6:
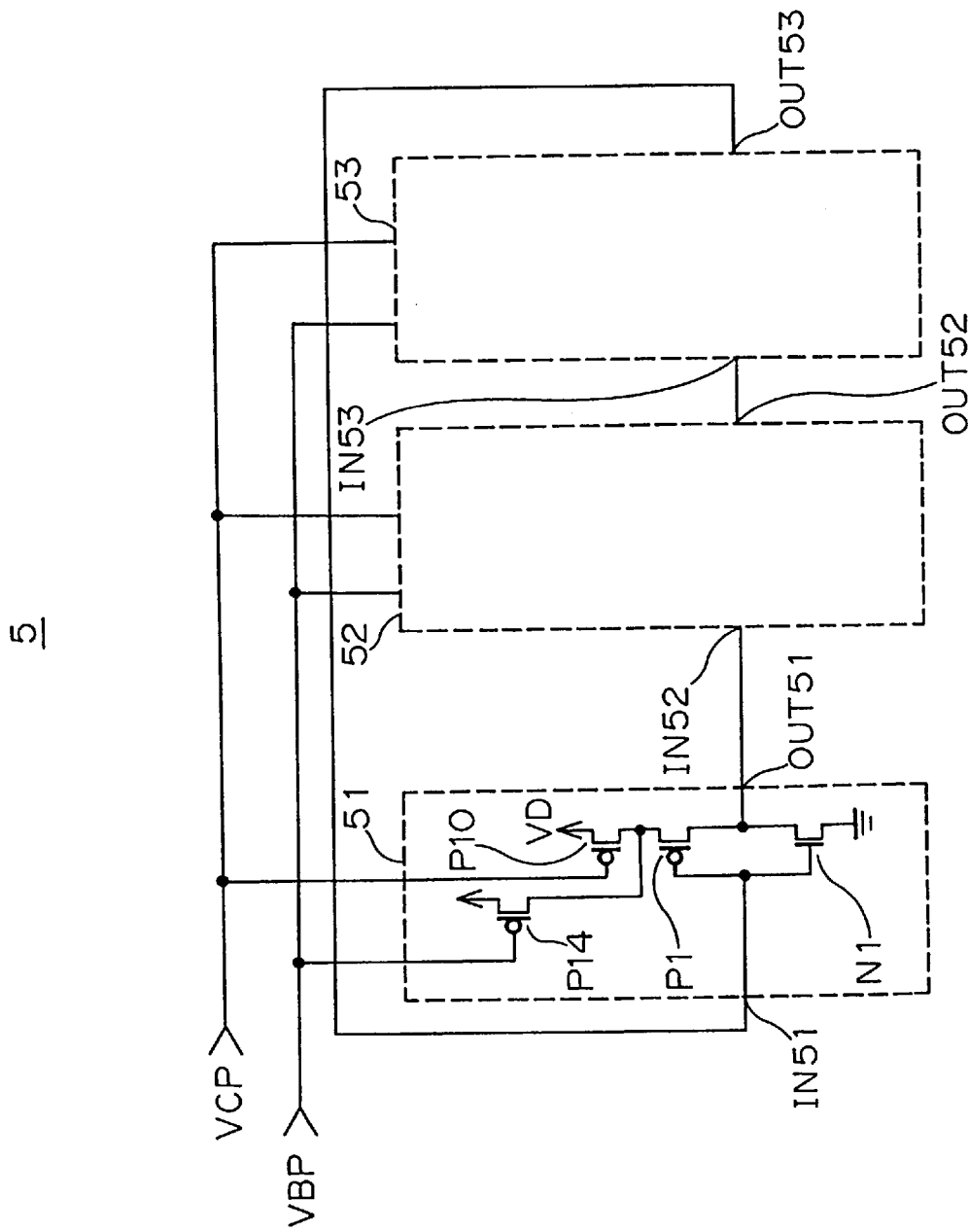
FIG. 6 is a circuit block diagram of the VCO in a fifth embodiment of the present invention.

The structure of the VCO 5 in the fifth embodiment is shown in FIG. 6. This VCO 5 is constituted of inverter circuits 51, 52 and 53 which are connected in series in a ring to form a loop. These inverter circuits 51, 52 and 53 are each constituted by replacing the PMOS transistors P11, P12 and P13 and the inverter gates IV 1, IV 2 and IV 3 in each of the inverter circuits 21, 22 and 23 constituting the VCO 2 in the second embodiment with a PMOS transistor P14. It is to noted that since the inverter circuits 51, 52 and 53 are structured almost identically to one another, the structure of the inverter circuit 51 is explained here as a representative example.

The gates of the PMOS transistor P1 and the NMOS transistor N1 are commonly connected to an input IN51 of the inverter circuit 51, whereas the drains of the PMOS transistor P1 and the NMOS transistor N1 are commonly connected to an output OUT 51 of the inverter circuit 51. The source of the NMOS transistor N1 is connected to a ground level and the source of the PMOS transistor P1 is commonly connected to the drains of the PMOS transistors P11 and P14.

In addition, the sources of the PMOS transistors P11 and P14 are connected to a source voltage level VD.

A control signal VCP is input to the gate of the PMOS transistor P11 and a control signal VBP is input to the gate of the PMOS transistor P14. It is to be noted that the control signals VCP and VBP are also input to the inverter circuits 52 and 53 through connections to the gates of the PMOS transistor groups (not shown) having functions and structural features identical to those of the PMOS transistor group, i.e., P10 and P14 in the inverter circuit 51.

The output OUT 51 of the inverter circuit 51 which is structured as described above, is connected to an input IN 52 of the inverter circuit 52, an output OUT 52 of the inverter circuit 52 is connected to an input IN 53 of the inverter circuit 53 and an output OUT 53 of the inverter circuit 53 is connected to the input IN 51 of the inverter circuit 51. In other words, the VCO 5 is constituted as a ring oscillator in which the inverter circuits 51, 52 and 53 are connected in a ring.

The operation of the VCO 5 in the fifth embodiment structured as described above is now explained.

First, the control signal VBP is set to a specific voltage level. Then, when the voltage level of the control signal VCP is changed, for instance, from 0 V to 3.3 V, the lengths of time required for the voltage levels of the output signals at the outputs OUT 51, 52 and 53 of the individual inverter circuits 51, 52 and 53 to shift from L to H, i.e., the charge time changes, and when this happens, the oscillating frequency of the VCO 5 is adjusted to a specific value.

When the voltage level of the control signal VBP is set to a higher value and the control signal VCP is shifted, for instance, from 0 V to 3.3 V in this state, the oscillating frequency of the VCO 5 will change in a higher frequency band. If, in contrast, the voltage level of the control signal VBP is set to a higher level, and the control signal VCP is shifted from, for instance, 0 V to 3.3 V the oscillating frequency of the VCO 5 will change in a lower frequency band.

As has been explained, in the VCO 5 in the fifth embodiment, since the PMOS transistor P14 is constituted as a constant current source which can be readjusted and the PMOS transistor P10 is constituted as a variable current source, it becomes possible to divide the oscillating frequency band into an arbitrary number of ranges with the voltage level of the control signal VBP as in the VCO 4 in the fourth embodiment. Thus, the adjustment of the oscillating frequency can be performed with an even greater degree of ease and a higher degree of accuracy compared to the VCO 1, the VCO 2 and the VCO 3 in the first, second and third embodiments. In addition, since the VCO 5 in this embodiment is structured so that the PMOS transistor P14 constituting the constant current source is controlled only with the control signal VBP, a reduction in the scale of the circuit is achieved in comparison to the VCO 1, the VCO 2 and the VCO 3 in the first, second and third embodiments, which all employ the plurality of control signals S1, S2 and S3.

(Sixth embodiment)

Figure 7:
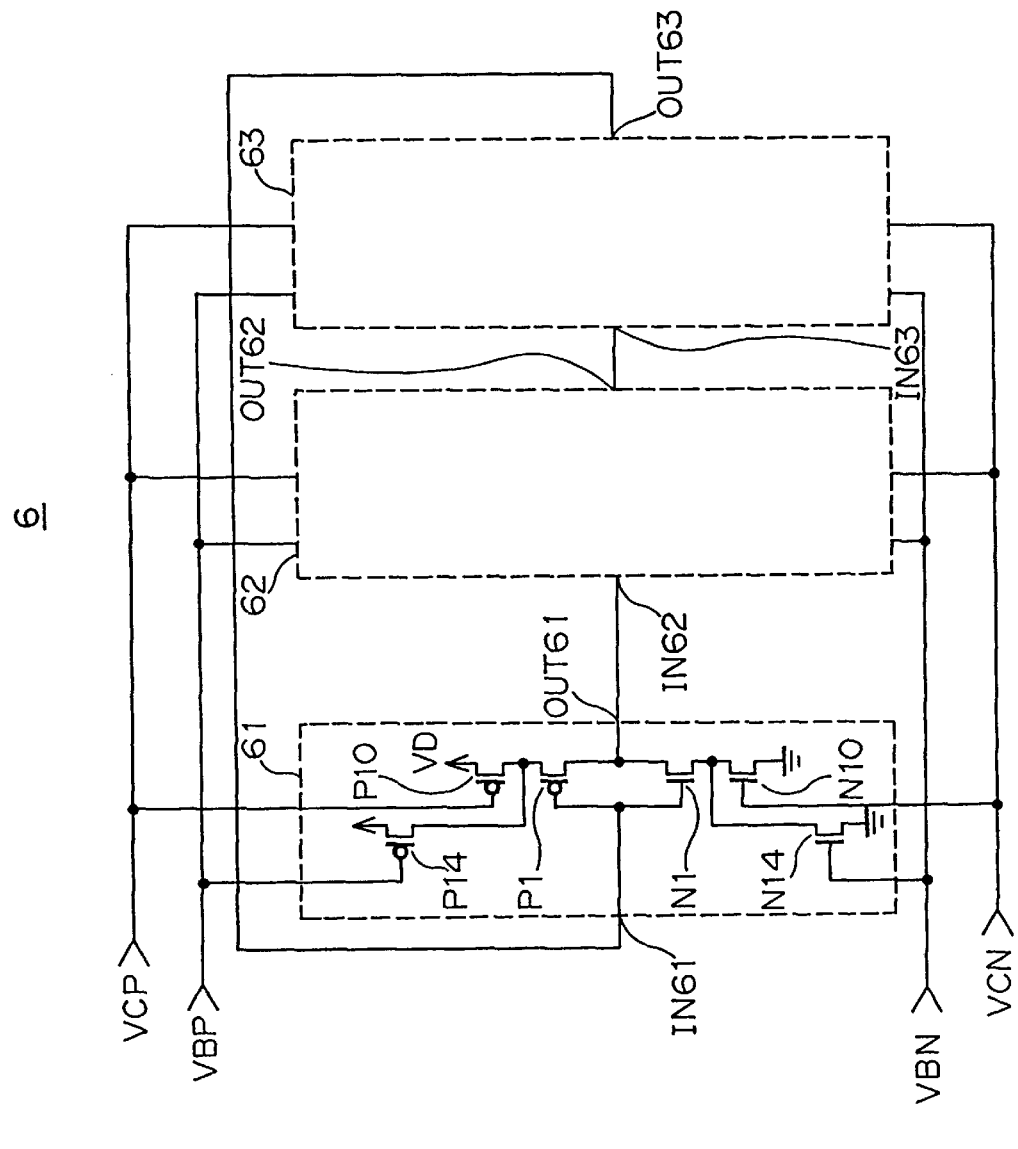
FIG. 7 is a circuit block diagram of the VCO in a sixth embodiment of the present invention.

The structure of the VCO 6 in the sixth embodiment is shown in FIG. 7.

This VCO 6 is constituted of inverter circuits 61, 62 and 63 which are connected in series in a ring to form a loop. These inverter circuits 61, 62 and 63 are each constituted by replacing the NMOS transistors N11, N12 and N13 with an NMOS transistor N14 and by further replacing the PMOS transistors P11, P12 and P13 and the inverter gates IV 1, IV 2 and IV 3 with a PMOS transistor P14 in each of the inverter circuits 31, 32 and 33 constituting the VCO 3 in the third embodiment. It is to noted that since the inverter circuits 61, 62 and 63 are structured almost identically to one another, the structure of the inverter circuit 61 is explained here as a representative example.

The gates of the PMOS transistor P1 and the NMOS transistor N1 are commonly connected to an input IN 61 of the inverter circuit 61, whereas the drains of the PMOS transistor P1 and the NMOS transistor N1 are commonly connected to an output OUT 61 of the inverter circuit 61. The source of the PMOS transistor P1 is commonly connected to the drains of the PMOS transistors P11 and P14 and the source of the NMOS transistor N1 is commonly connected to the drains of the NMOS transistors N10 and N14. In addition, the sources of the PMOS transistors P10 and P14 are connected to a source voltage level VD and the sources of the NMOS transistors N10 and N14 are connected to a ground level.

A control signal VCP is input to the gate of the PMOS transistor P10 and a control signal VBP is input to the gate of the PMOS transistor P14.

Moreover, a control signal VCN is input to the gate of the NMOS transistor N10 and a control signal VBN is input to the gate of the NMOS transistor N14.

It is to be noted that the control signals VCP and VBP are also input to the gates of the PMOS transistor groups (not shown) having functions and structural features identical to those of the PMOS transistor group, i.e., P10 and P14 in the inverter circuit 61. Likewise, the control signals VCN and VBN. are also connected to the gates of the NMOS transistor groups (not shown) having functions and structural features identical to those of the NMOS transistors N10 and N14 in the inverter circuit 61.

The output OUT 61 of the inverter circuit 61 which is structured as described above, is connected to an input IN 62 of the inverter circuit 62, an output OUT 62 of the inverter circuit 62 is connected to an input IN 63 of the inverter circuit 63 and an output OUT 63 of the inverter circuit 63 is connected to the input IN 61 of the inverter circuit 61. In other words, the VCO 6 is constituted as a ring oscillator in which the inverter circuits 61, 62 and 63 are connected in a ring.

The operation of the VCO 6 in the sixth embodiment structured as described above is now explained.

First, the control signals VBP and VBN are set to specific voltage levels. Then, when the voltage level of the control signal VCP is changed, for instance, from 0 V to 3.3 V, the lengths of time required for the voltage levels of the output signals at the outputs OUT 61, 62 and 63 of the individual inverter circuits 61, 62 and 63 to shift from L to H, i.e., the charge time change, and when this happens, the oscillating frequency of the VCO 6 is adjusted to a specific value.

When the voltage level of the control signal VBP is reset to a lower value and the control signal VCP is shifted, for instance, from 0 V to 3.3 V in this state, the oscillating frequency of the VCO 5 will change in a higher frequency band. If, in contrast, the voltage level of the control signal VBP is set to a higher level, and the control signal VCP is shifted, for instance, from 0 V to 3.3 V the oscillating frequency of the VCO 5 will change in a lower frequency band.

If, on the other hand, the voltage level of the control signal VCN is changed, for instance, from 0 V to 3.3 V, the lengths of time required for the voltage levels of the output signals at the outputs OUT 61, 62 and 63 of the individual inverter circuits 61, 62 and 63 to shift from H to L, i.e., the discharge time change, and when this happens, the oscillating frequency of the VCO 6 is adjusted to a specific value When the voltage level of the control signal VBN is reset to a higher value and the control signal VCN is shifted, for instance, from 0 V to 3.3 V in this state, the oscillating frequency of the VCO 6 will change in a higher frequency band. If, in contrast, the voltage level of the control signal VBN is set to a lower level, and the control signal VCN is shifted, for instance, from 0 V to 3.3 V the oscillating frequency of the VCO 6 will change in a lower frequency band.

As has been explained, with the VCO 6 in the sixth embodiment, advantages that are similar to those achieved by the VCO 4 in the fourth embodiment and the VCO 5 in the fifth embodiment are achieved.

Furthermore, with the VCO 6, the rise times of the output signals at the outputs OUT 61, 62 and 63 of the individual inverter circuits 61, 62 and 63 can be adjusted with the control signals VCP and VBP, and also their fall times can be adjusted with the control signals VCN and VBN. Thus, the duty ratio of the output signals output by the VCO 6 can be adjusted with ease.

(Seventh embodiment)

Figure 8:
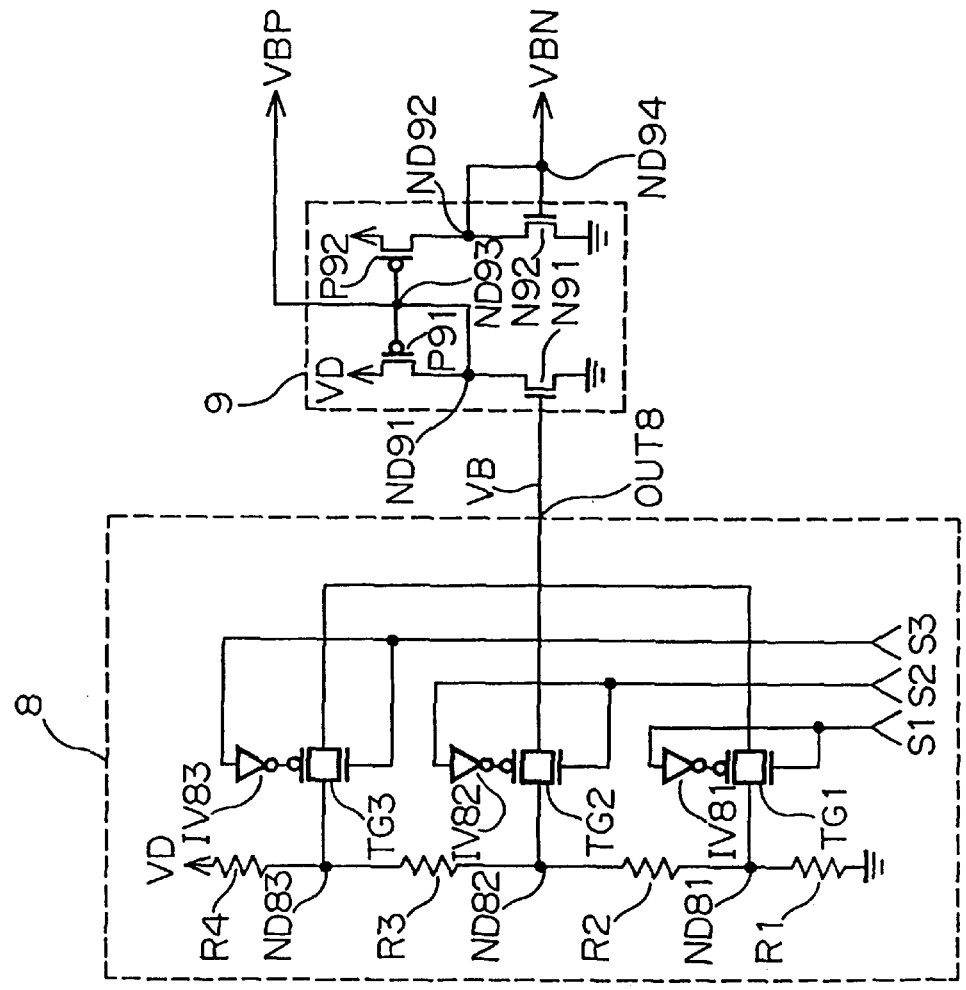
FIG. 8 is a circuit block diagram of a control signal generating circuit that may be employed in the VCO in the fourth, fifth and sixth embodiments shown in FIGS. 5, 6 and 7 respectively.

A control signal generating circuit 7 shown in FIG. 8 may be added onto the VCO 4, the VCO 5 and the VCO 6 in the fourth, fifth and sixth embodiment explained earlier.

This control signal generating circuit 7 comprises a bias voltage selection circuit 8 and a inverted signal output circuit 9, and is constituted in such a manner that control signals VBP and VBN can be generated with control signals S1, S2 and S3 that are input.

Now, the structure of the bias voltage selection circuit 8 is explained in detail. The bias voltage selection circuit 8 comprises resistive elements R1, R2, R3 and R4, inverter gates IV 81, IV 82 and IV 83 and transfer gates TG1, TG2 and TG3. It is to be noted that the transfer gates TG1, TG2 and TG3 are each constituted of a PMOS transistor (not shown) and an NMOS transistor (not shown), with the source of the PMOS transistor and the source of the NMOS transistor connected with each other and the drain of the PMOS transistor and the drain of the NMOS transistor connected with each other.

The resistive elements R1, R2, R3 and R4 are connected in series between a source voltage level VD and a ground level. The sources of the PMOS transistor and the NMOS transistor constituting the transfer gate TG1 are connected to a node ND81 provided between the resistive element R1 and the resistive element R2. Likewise, the transfer gate TG2 is connected to a node ND82 provided between the resistive element R2 and the resistive element R3 and the transfer gate TG3 is connected to a node ND83 provided between the resistive element R3 and the resistive element R4. Furthermore, the drains of the PMOS transistors and the drains of the NMOS transistors constituting the transfer gates TG1, TG2 and TG3 are all connected to an output OUT 8 of the bias voltage selection circuit 8.

The control signal S1 is input to the gate of the NMOS transistor of the transfer gate TG 1, and a logically inverted signal of the control signal S1 is input to the gate of the PMOS transistor of the transfer gate TG1 via the inverter gate IV 81. Likewise, the control signal S2 is input to the gate of the NMOS transistor of the transfer gate TG2, and a logically inverted signal of the control signal S2 is input to the gate of the PMOS transistor of the transfer gate TG2 via the inverter gate IV 82. The control signal S3 is input to the gate of the NMOS transistor of the transfer gate TG3, and a logically inverted signal of the control signal S3 is input to the gate of the PMOS transistor which gate corresponds to the transfer gate TG3 via the inverter gate IV 83.

Next, the structure of the inverted signal output circuit 9 is explained in detail. The inverted signal output circuit 9 comprises PMOS transistors P91 and P92 and NMOS transistors N91 and N92. The sources of the PMOS transistors P91 and P92 are connected to the source voltage level VD, whereas the sources of the NMOS transistors N91 and N92 are connected to a ground level. In addition, the drain of the PMOS transistor P91 and the drain of the NMOS transistor N91 are connected to a node ND91, and the drain of the PMOS transistor P92 and the drain of the NMOS transistor N92 are connected to a node ND92. Furthermore, the gate of the PMOS transistor P91 and the gate of the PMOS transistor P92 are connected to a node ND93, with the node ND91 also connected to the node ND93. The gate of the NMOS transistor N92 is connected to a node ND94, with the node ND92 also connected to the node ND94. Thus, the inverted signal output circuit 9 is structured as a current mirror circuit.

A control signal VB output from the output OUT 8 of the bias voltage selection circuit 8 is input to the gate of the NMOS transistor N91 in the inverted signal output circuit 9, and with this control signal VB thus input, the control signal VBP is output from the node ND93 in the inverted signal output circuit 9 and the control signal VBN is output from the node ND94.

The operation of the control signal generation circuit 7 structured as described above is now explained in detail.

First, when the voltage of the control signal S1 is set to H and the voltage levels of the control signals S2 and S3 are set to L, the transfer gate TG1 enters an on state and the transfer gates TG2 and TG3 enter an off state. With this, the control signal VB with the voltage level at the node ND81 is output from the output OUT 8.

On the other hand, when the voltage of the control signal S2 is set to H and the voltage levels of the control signals S1 and S3 are set to L, the transfer gate TG2 enters an on state and the transfer gates TG1 and TG3 enter an off state. With this, the control signal VB with the voltage level at the node ND82 is output from the output OUT 8.

In addition, when the voltage of the control signal S3 is set to H and the voltage levels of the control signals S1 and S2 are set to L, the transfer gate TG3 enters an on state and the transfer gates TG1 and TG2 enter an off state. With this, the control signal VB with the voltage level at the node ND83 is output from the output OUT 8.

As has been explained, the control signal VB, which may be set at 3 different voltage levels with the control signals S1, S2 and S3, is input to the inverted signal output circuit 9. Then, since the inverted signal output signal 9 is constituted as a current mirror circuit, as mentioned earlier, it outputs the control signal VBP achieved by inverting the voltage level of the control signal VB and also outputs the control signal VBN achieved by inverting the voltage level of the control signal VBP.

Now, if the control signals VBP and VBN are to be provided for the VCOs 4, 5 and 6 in the fourth, fifth and sixth embodiments described above from the outside of the IC chips in which the VCO 4, 5 and 6 are mounted, for instance, there is a concern that noise caused by the inductance at the lead in each of the IC chips may become superimposed upon the control signals VBP and VBN resulting in a fluctuation of the voltage levels. Such a fluctuation in the voltage levels of the control voltages VBP and VBN prevents stable oscillation.

To eliminate this problem, the control signal generating circuit 7 may be provided inside the IC chip along with the VCO 4, 5 or 6 so that the voltage levels of the control signals VBP and VBN can be selected by the control signals S1, S2 and S3 to prevent any adverse effect of noise from the outside of the VCO 4, 5 or 6. Furthermore, since the inverted signal output circuit 9 in the control signal generating circuit 7 is constituted as a current mirror circuit, the adjustments of the voltage levels of the control signal VBP and the control signal VBN can be performed in a complete interlock state. Thus, the oscillating frequencies in the VCOs 4, 5 and 6 can be stabilized to a very high degree.

In addition, with the VCO 4, 5 or 6 and the control signal generating circuit 7 provided together inside an IC chip, a separate source circuit or the like for generating control signals VBP and VBN is not required, which will result in a reduction in product cost.

It is to be noted that while the control signal generating circuit 7 is structured so that the voltage levels of the control signals VBP and VBN are switched through 3 levels with the control signals S1, S2 and S3, the switching does not have to be implemented over those three levels and through a simple circuit modification, the number of steps through which the voltage levels are switched can be increased.

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

For instance, while the explanation has been given in reference to the embodiments in which three inverter circuits are connected in a loop, the number of inverter circuits is not limit to three. In addition, while, in reference to the first and third embodiments, the explanation has been given of cases in which the three NMOS transistors N11, N12 and N13 are employed to constitute constant current sources, the oscillating frequency can be adjusted to a higher degree of accuracy by increasing the number of the NMOS transistors. Likewise, the number of PMOS transistors employed as constant current sources in the second and third embodiments is not restricted to three, i.e., the PMOS transistors P11, P12 and P13, either.

What is claimed is:

1. A voltage-controlled oscillator, comprising:
    an odd number of inverter circuits connected in series in a ring, wherein each of said inverter circuits is connected between a first power supply voltage and a second power supply voltage;
    a plurality of sub-frequency band selection circuits which receive a commonly input select signal and which respectively correspond to said inverter circuits, each of said plurality of sub-frequency band selection circuits connected between a corresponding one of said inverter circuits and either said first power supply voltage or said second power supply voltage, wherein said plurality of sub-frequency band selection circuits are responsive to the commonly input select signal to select a desired sub-frequency band from a plurality of sub-frequency bands, and to divide a range of frequency of output pulse signals respectively output from corresponding ones of said inverter circuits; and
    a plurality of output pulse signal frequency adjustment circuits which receive a commonly input bias signal and which respectively correspond to each of said inverter circuits and said plurality of sub-frequency band selection circuits, each of said plurality of output pulse signal frequency adjustment circuits connected in parallel to a corresponding one of said sub-frequency band selection circuits and between a corresponding one of said inverter circuits and either said first power supply voltage or said second power supply voltage, said plurality of output pulse signal frequency adjustment circuits responsive to the commonly input bias signal to adjust the frequency of said output pulse signals respectively output from corresponding ones of said inverter circuits within said desired sub-frequency band.

2. A voltage-controlled oscillator according to claim 1, wherein:
    each of said sub-frequency band selection circuits selects said desired sub-frequency band by adjusting a fall time of the output pulse signal output from a corresponding one of said inverter circuits; and
    each of said output pulse signal frequency adjustment circuits adjusts said frequency by changing said fall time of the output pulse signal output from a corresponding one of said inverter circuits.

3. A voltage-controlled oscillator according to claim 2, wherein:
    each of said sub-frequency band selection circuits is comprised of a current control circuit that that is responsive to said commonly input select signal to control a discharge current at an output point where the output pulse signal is output from the corresponding one of said inverter circuits.

4. A voltage-controlled oscillator according to claim 3, wherein:
    said commonly input select signal is a parallel signal denoting a plurality of bits and said discharge current is controlled by said current control circuit according to logical combinations of said plurality of bits.

5. A voltage-controlled oscillator according to claim 3, wherein:
    said current control circuit is comprised of transistors that control said discharge current.

6. A voltage-controlled oscillator according to claim 1, wherein:
    each of said sub-frequency band selection circuits selects said desired sub-frequency band by adjusting a rise time of the output pulse signal output from the corresponding one of said inverter circuits; and
    each of said output pulse signal frequency adjustment circuits adjusts said frequency by changing said rise time of the output pulse signal output from the corresponding one of said inverter circuits.

7. A voltage-controlled oscillator according to claim 6, wherein:
    each of said sub-frequency band selection circuits is comprised of a current control circuit that is responsive to the commonly input select signal to control a charge current at an output point where the output pulse signal is output from a corresponding one of said inverter circuits.

8. A voltage-controlled oscillator according to claim 7, wherein:
    said commonly input select signal is a parallel signal denoting a plurality of bits and said charge current is controlled by said current control circuit according to logical combinations of said plurality of bits.

9. A voltage-controlled oscillator according to claim 7, wherein:
    said current control circuit is comprised of transistors that control said charge current.

10. A voltage-controlled oscillator according to claim 1, wherein:

each of said sub-frequency band selection circuits selects said desired sub-frequency band by adjusting a fall time and a rise time of the output pulse signal output from the corresponding one of said inverter circuits; and each of said output pulse signal frequency adjustment circuits adjusts said frequency by changing said fall time and said rise time of the output pulse signal output from the corresponding one of said inverter circuits.

11. A voltage-controlled oscillator according to claim 10, wherein:

said commonly input select signal includes a first select signal and a second select signal; and each of said sub-frequency band selection circuits is comprised of a current control circuit that is responsive to said first select signal to control a discharge current at an output point where the output pulse signal is output from the corresponding one of said inverter circuits and that is responsive to said second select signal to control a charge current at said output point where the output pulse signal is output from the corresponding one of said inverter circuits.

12. A voltage-controlled oscillator according to claim 11, wherein:

said first select signal is a first parallel signal denoting a first plurality of bits;

said second select signal is a second parallel signal denoting a second plurality of bits; and said discharge current is controlled by said current control circuit according to logical combinations of said first plurality of bits and said charge current is controlled by said current control circuit according to logical combinations of said second plurality of bits.

13. A voltage-controlled oscillator according to claim 11, wherein:

said current control circuit comprises a first transistor that controls said discharge current according to said first select signal and a second transistor that controls said charge current according to said second select signal.

14. A voltage-controlled oscillator according to claim 13, further comprising a control signal generating circuit comprised of a bias voltage selection circuit and an inverted signal output circuit, wherein:

said bias voltage selection circuit includes a plurality of resistive elements connected in series between a first source and a second source to selectively output said commonly input bias voltage signal as a plurality of signals having different voltage values achieved through voltage division performed by each of said resistive elements; and said inverted signal output circuit outputs said first select signal and said second select signal having a polarity opposite from the polarity of said first select signal by inputting said bias voltage signal selectively output by said bias voltage selection circuit.

15. A voltage-controlled oscillator according to claim 14, wherein said inverted signal output circuit is a current mirror circuit.

16. A voltage-controlled oscillator according to claim 14, wherein:

said bias voltage selection circuit includes a plurality of transfer gates that are controlled in conformance to logical combinations of individual bits of a parallel signal that is input to said bias voltage selection circuit; and said plurality of signals are selected by said plurality of transfer gates.

17. A voltage-controlled oscillator according to claim 16, wherein said inverted signal output circuit is a current mirror circuit.

* * * * *